(12) United States Patent
Watanabe

(10) Patent No.: US 6,288,479 B1
(45) Date of Patent: Sep. 11, 2001

(54) PIEZOELECTRIC TRANSFORMER

(75) Inventor: Yoshiyuki Watanabe, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/441,961

(22) Filed: Nov. 17, 1999

(30) Foreign Application Priority Data

Nov. 18, 1998 (JP) .................................................. 10-328208

(51) Int. Cl.$^7$ .................................................. H01L 41/107
(52) U.S. Cl. .................................................................. 310/359
(58) Field of Search ............................................... 310/359

(56) References Cited

U.S. PATENT DOCUMENTS

| | | | |
|---|---|---|---|
| 5,424,602 | * 6/1995 | Sato et al. | 310/359 |
| 5,751,092 | * 5/1998 | Abe | 310/359 |
| 5,763,983 | * 6/1998 | Huang | 310/360 |
| 5,777,425 | * 7/1998 | Ino et al. | 310/359 |
| 5,872,419 | * 2/1999 | Hall et al. | 310/359 |

FOREIGN PATENT DOCUMENTS

| | | | |
|---|---|---|---|
| 7-221359 | * 8/1995 | (JP) | 310/359 |
| 8-213666 | * 8/1996 | (JP) | 310/359 |
| 11-145528 | * 5/1999 | (JP) | 310/359 |

* cited by examiner

*Primary Examiner*—Thomas M. Dougherty
(74) *Attorney, Agent, or Firm*—Rosenman & Colin, LLP.

(57) ABSTRACT

There is provided a piezoelectric transformer. The piezoelectric transformer includes: a long-plate-shaped piezoelectric member being polarized in a thickness direction and a longitudinal direction; and input electrodes and output electrodes mounted on the piezoelectric member, wherein a thickness ratio LC/LA of the piezoelectric member ranges from 0.01 to 0.06, LC and LA being a thickness and a longitudinal length of the piezoelectric member, respectively. The piezoelectric member consists of either laminated piezoelectric layers or a monolayer. A thickness ratio LC/LA of the piezoelectric member 10 ranges from 0.01 to 0.06, more preferably, 0.02 to 0.05, thereby resulting in an enhanced efficiency, wherein LA and LC refer to a length and a thickness of the piezoelectric member 10, respectively. Further, an electrode length ratio LB/LA of the piezoelectric member ranges from 0.6 to 0.9, more preferably, 0.7 to 0.8, wherein LB represents a length of the input electrodes. The piezoelectric transformer of the present invention exhibits an increased output power and a larger voltage-rise ratio.

7 Claims, 6 Drawing Sheets

PIEZOELECTRIC TRANSFORMER

FIELD OF THE INVENTION

The present invention relates to a piezoelectric transformer; and, more particularly, to a center-driving type piezoelectric transformer.

BACKGROUND OF THE INVENTION

FIG. 8 shows an exemplary piezoelectric transformer of a prior art, e.g., a center-driving type piezoelectric transformer disclosed in Japanese Patent Laid-Open No.9-74236 which has a driving section located at a center portion thereof. As shown in FIG. 8, input electrodes 51 and 52 are placed on top and bottom surfaces of a center portion of a sheet or plate type, e.g., long-plate-shaped, piezoelectric member 50 when viewed from top, respectively, wherein the input electrodes 51 and 52 face with each other. The center portion of the piezoelectric member 50 disposed between the input electrodes 51 and 52 are polarized in a thickness direction, wherein the center portion forms a driving section of the piezoelectric transformer. Output electrodes 55 and 56 are formed on right and left sides of the piezoelectric member 50, respectively.

Right and left end portions of the piezoelectric member 50 are polarized in opposite longitudinal directions with each other, wherein the end portions form power generating sections of the piezoelectric transformer. A ratio of a length L2 of the driving section to a longitudinal length L1 of the piezoelectric member 50 in the longitudinal direction, i.e., L2/L1, ranges from 0.3 to 0.6. With this configuration, a larger voltage-rise ratio is obtained.

However, in the prior art piezoelectric transformer, no consideration is given to the thickness of the piezoelectric member incorporated therein. Experimental data clearly indicates that the thickness of the piezoelectric member considerably affects the efficiency, i.e., a ratio of an output power to an input power, thereof. It is preferable to have in a piezoelectric transformer an enhanced efficiency, an increased output power and a large voltage-rise ratio simultaneously.

SUMMARY OF THE INVENTION

It is, therefore, a primary object of the present invention to provide a piezoelectric transformer with a consideration given to the thickness of a piezoelectric member incorporated therein. It is another object of the present invention to provide a piezoelectric transformer exhibiting an enhanced efficiency, an increased output power and a large voltage-rise ratio thereof simultaneously.

In order to achieve the above-mentioned object, in accordance with one aspect of the present invention, there is provided a piezoelectric transformer comprising: a long-plate-shaped piezoelectric member being polarized in a thickness direction and a longitudinal direction; and input electrodes and output electrodes mounted on the piezoelectric member, wherein a thickness ratio LC/LA of the piezoelectric member ranges from 0.01 to 0.06, LC and LA being a thickness and a longitudinal length of the piezoelectric member, respectively. More preferably, the ratio LC/LA ranges from 0.02 to 0.05. In another aspect of the present invention, an electrode length ratio LB/LA of the piezoelectric member ranges from 0.6 to 0.9, LB being a length of the input electrodes in the longitudinal direction. More preferably, the ratio LB/LA ranges from 0.7 to 0.8.

One important feature of the present invention is that the piezoelectric may include a plurality of thin piezoelectric sheets, each of the input electrodes, e.g., input electrode patterns, being formed on top of a center portion of each piezoelectric sheet; outer electrodes are formed on two opposite sides of the center portion of the piezoelectric member; and the input electrodes are alternatively connected to the outer electrodes.

BRIEF DESCRIPTION OF THE DRAWINGS

The above and other objects and features of the present invention will become apparent from the following description of preferred embodiments given with reference to the accompanying drawings, in which.

DETAILED DESCRIPTION OF THE PREFERRED EMBODIMENTS

In accordance with the present invention, there is provided a piezoelectric transformer. The piezoelectric transformer comprises: a long-plate-shaped piezoelectric member being polarized in a thickness direction and a longitudinal direction, wherein the piezoelectric member consists of either laminated piezoelectric layers or a monolayer; and input electrodes and output electrodes mounted on the piezoelectric member. In the present invention, a thickness ratio LC/LA of the piezoelectric member ranges from 0.01 to 0.06, LC and LA being a thickness and an overall length, i.e., a longitudinal length of the piezoelectric member, respectively.

Figure 1:
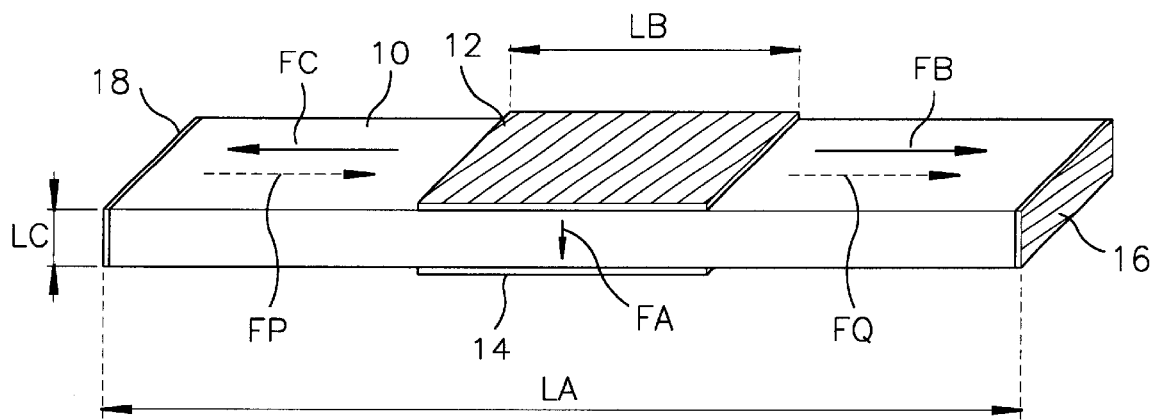
FIG. 1 shows a perspective view of a piezoelectric transformer in accordance with a preferred embodiment of the present invention.

From now on, preferred embodiments of the present invention will be described in detail. Referring to FIG. 1, there is shown a perspective view of a piezoelectric transformer in accordance with a preferred embodiment of the present invention. As illustrated in FIG. 1, the piezoelectric transformer comprises a piezoelectric member 10, input electrodes 12 and 14, and output electrodes 16 and 18.

The input electrodes 12 and 14 are located or formed on top and bottom surfaces, respectively of a center portion of the piezoelectric member 10 when viewed from top. In other words, the input electrodes 12 and 14 are facing each other with the piezoelectric member 10 disposed therebetween. The center portion of the piezoelectric member 10 is polarized in a thickness direction, e.g., a direction indicated by an arrow FA shown in FIG. 1 or its reverse direction, by applying a polarization voltage on the input electrodes 12 and 14. This center portion of the piezoelectric member 10 located between the electrodes 12 and 14 becomes a driving section of the piezoelectric transformer. The output electrodes 16 and 18 are mounted on or coupled to right and left sides of the piezoelectric member 10, respectively.

Right and left end portions of the piezoelectric member 10 are polarized in opposite longitudinal directions, e.g., directions indicated by arrows FB and FC shown in FIG. 1 or the reverse directions thereof by the output electrodes 16 and 18, wherein the end portions form power generating sections of the piezoelectric transformer. Arrows FP and FQ in FIG. 1 will be described later.

Figure 2:
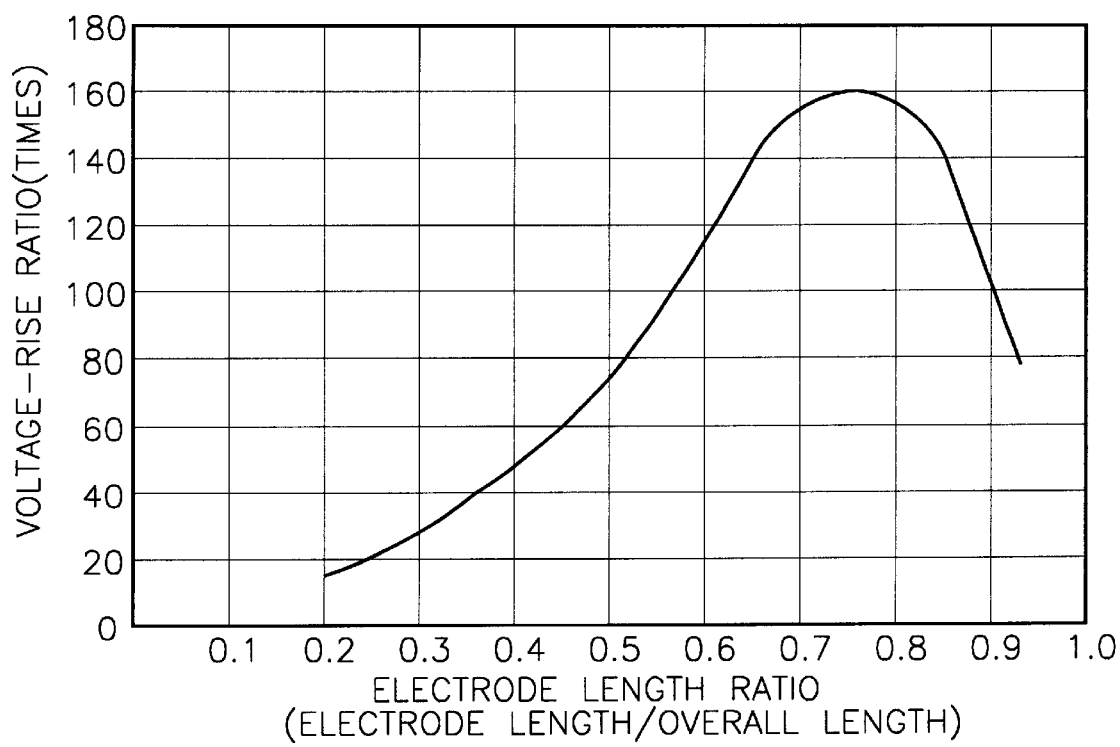
FIG. 2 is a graph representing the relationship between an electrode length ratio and a voltage-rise ratio of the piezoelectric transformer in accordance with the preferred embodiment of the present invention.

The relationship between an electrode length ratio and a voltage-rise ratio of the piezoelectric transformer in accordance with the preferred embodiment of the present invention obtained experimentally is illustrated in FIG. 2. In this case, the electrode length ratio is represented as a ratio of a length LB of the input electrodes 12 and 14 to a longitudinal length LA of the piezoelectric member 10 in the longitudinal direction. In the embodiment, the longitudinal length LA of the piezoelectric member 10 is 35 mm. The voltage-rise ratio is represented as a ratio $V_{out}/V_{in}$, wherein $V_{out}$ presents an output voltage outputted between electrodes 16 and 18 and $V_{in}$ represents an input voltage applied between the input electrodes 12 and 14. As shown in FIG. 2, the voltage-rise ratio of the embodiment reaches a peak value, i.e., a maximum value of about 160 in the graph when the electrode length ratio is about 0.75. The voltage-rise ratio is equal to or greater than 100 when the electrode length ratio ranges from 0.6 to 0.9; and greater than 150 when the electrode length ratio ranges from 0.7 to 0.8.

Figure 3:
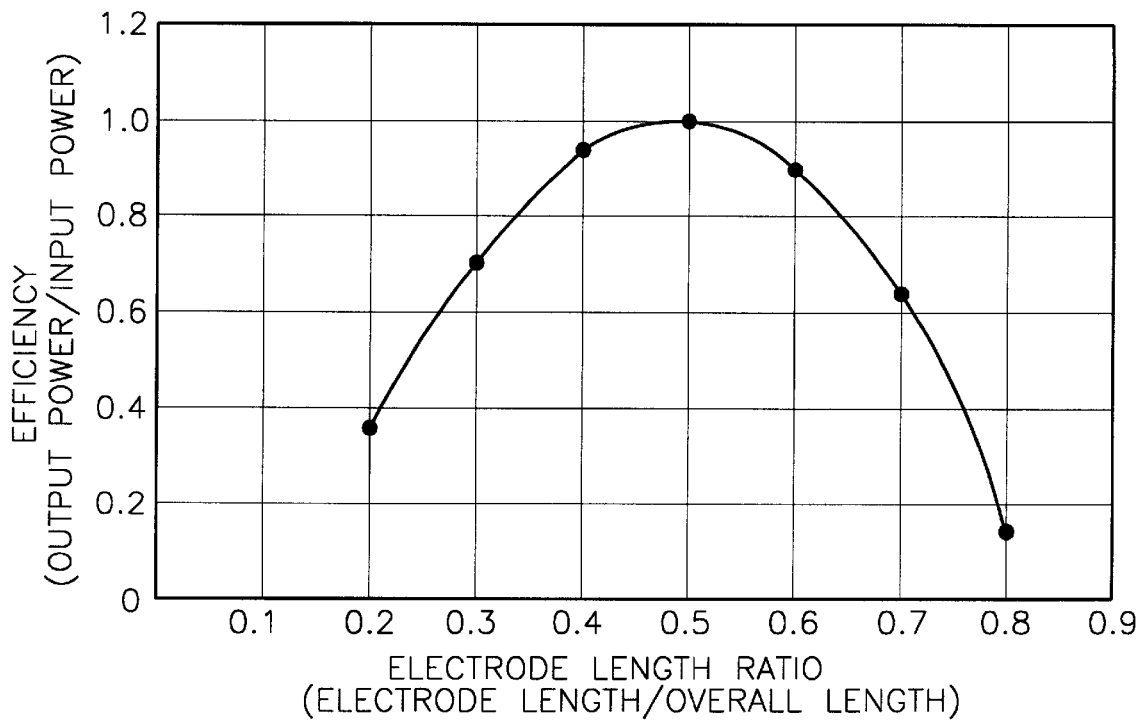
FIG. 3 is a graph depicting the relationship between an electrode length ratio and an efficiency of the piezoelectric transformer in accordance with the preferred embodiment of the present invention.
Figure 4:
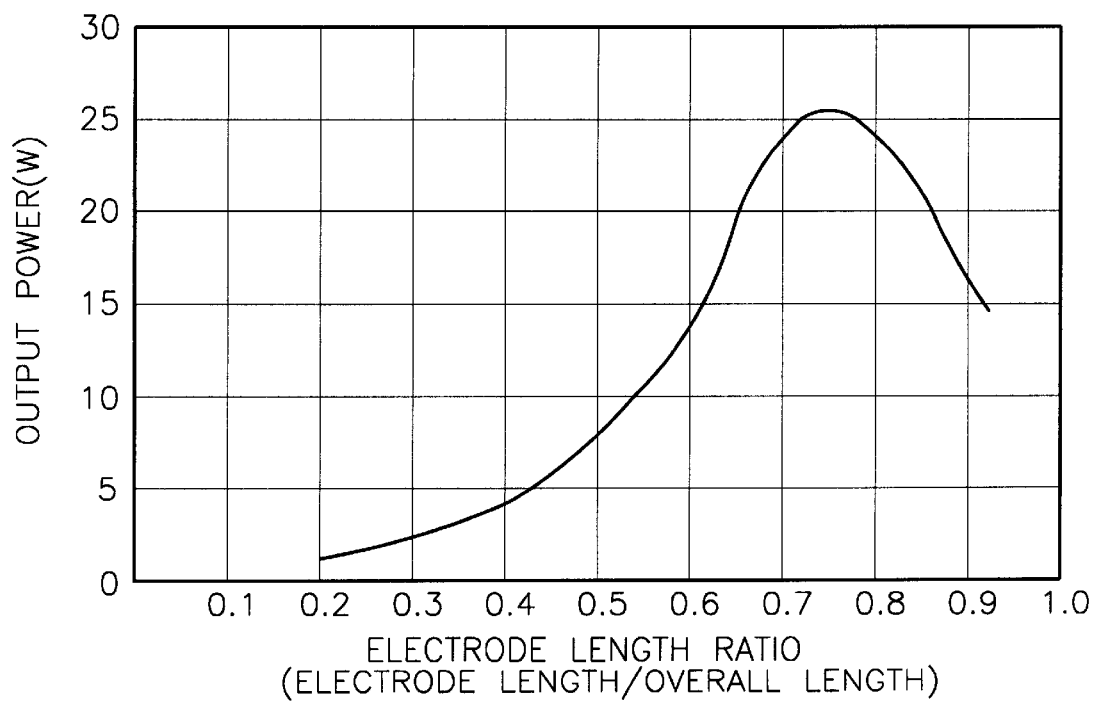
FIG. 4 is a graph expressing the relationship between an electrode length ratio and an output power of the piezoelectric transformer in accordance with the preferred embodiment of the present invention.

The relationship between an electrode length ratio and an efficiency of the piezoelectric transformer in accordance with the preferred embodiment obtained experimentally is depicted in FIG. 3. In this case, the efficiency is represented as a ratio $P_{out}/P_{in}$ wherein $P_{out}$ and $P_{in}$ represent output power and input power, respectively. As shown in FIG. 3, the efficiency reaches a peak value, i.e., a maximum value of about 1.0 when the electrode length ratio thereof is about 0.5. Meanwhile, the relationship between an electrode length ratio and an output power of the piezoelectric transformer in accordance with the preferred embodiment obtained experimentally is illustrated in FIG. 4. As illustrated in FIG. 4, the output power of the embodiment reaches a peak value, i.e., a maximum value of about 25 W when the electrode length ratio thereof is about 0.75. An output power equal to or greater than about 14 W is obtained when the electrode length ratio ranges from 0.6 to 0.9; and an output power equal to or greater than about 24 W is obtained when the electrode length ratio ranges from 0.7 to 0.8.

As is apparent from FIGS. 2 and 4, the voltage-rise ratio and the output power vary in a similar manner with the electrode length ratio. For example, the voltage-rise ratio and the output power have corresponding maximum values, respectively when the electrode length ratio is about 0.75. In contrast, the electrode length ratio at which the piezoelectric transformer exhibits the maximum efficiency is 0.5 as shown in FIG. 3, not coinciding with the electrode length ratio at which the piezoelectric transformer exhibits the maximum voltage-rise ratio and the output power. In other words, if the electrode length ratio is set at 0.75 in order to obtain the maximum voltage-rise ratio results in obtaining the maximum output power. The efficiency in this instance, however, decreases to 0.4. Meanwhile, if the electrode length ratio is set at about 0.5 in order to obtain the maximum efficiency, it results in voltage-rise ratio decreasing to about 70 which is less than a half of the corresponding maximum value and the output power decreasing to 8 W which is less than 1/3 of the corresponding maximum value.

Figure 5:
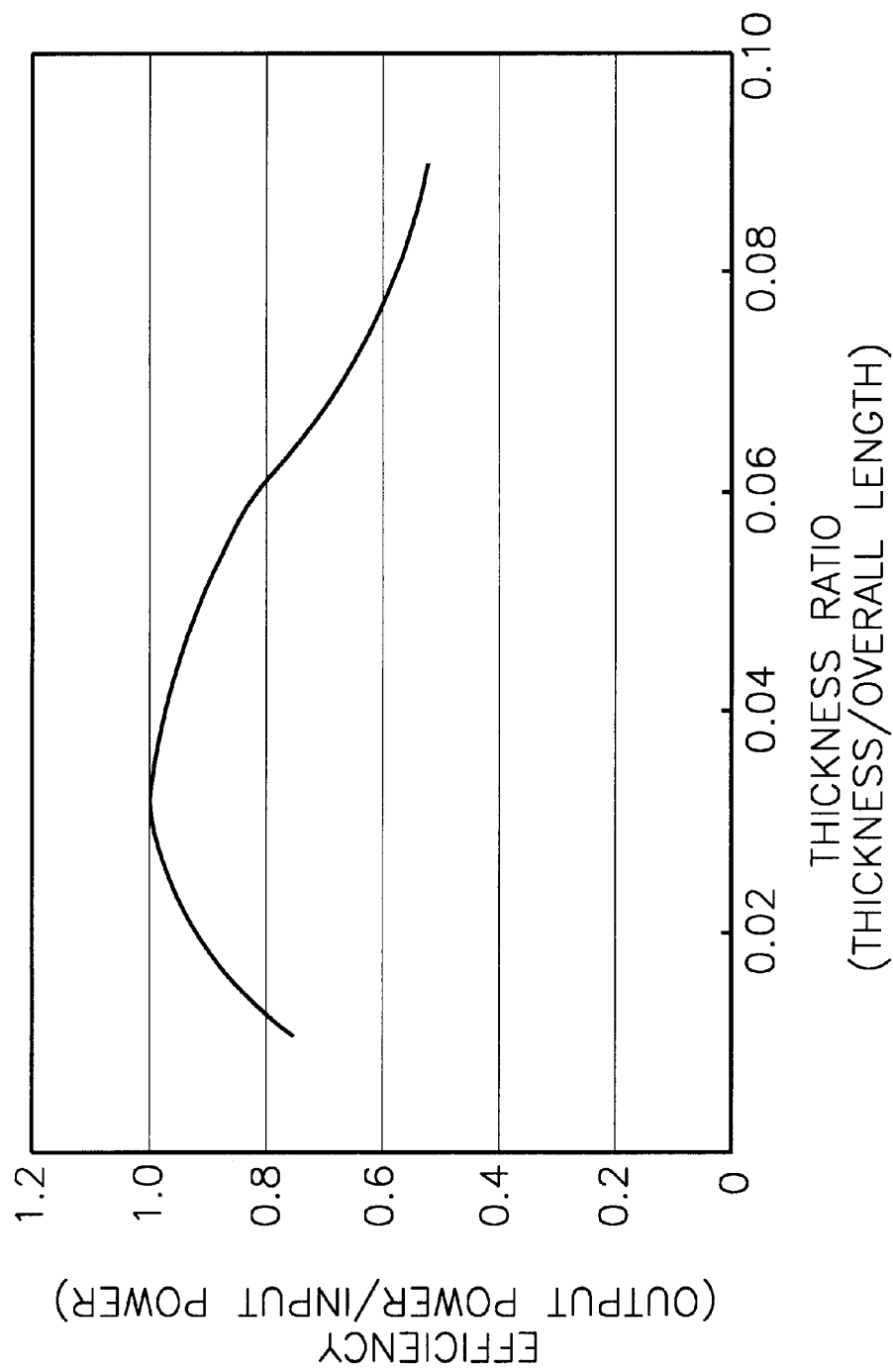
FIG. 5 is a graph presenting the relationship between a thickness ratio and an efficiency of the piezoelectric transformer in accordance a the preferred embodiment of the present invention.

In order to alleviate the above-mentioned problems, a consideration was given in the preferred embodiment of the present invention to the thickness of the piezoelectric member 10 incorporated in the transformer. FIG. 5 is an experimentally obtained graph illustrating the relationship between a thickness ratio and an efficiency of the piezoelectric member 10 in accordance with a preferred embodiment of the present invention. In this case, the thickness ratio is represented by a ratio LC/LA, wherein LC and LA are the thickness and the longitudinal length of the piezoelectric member 10, respectively. The graph of FIG. 5 is obtained from the samples having their electrode length ratios set at about 0.75 to thereby guarantee the maximum voltage-rise ratio and the maximum output power. As presented in FIG. 5, the efficiency reaches a maximum value of approximately 1.0 when the thickness ratio is about 0.03. An efficiency thereof equal to or greater than about 0.8 is obtained when the thickness ratio ranges from 0.01 to 0.06; and further, an efficiency thereof equal to or greater than 0.9 is obtained when the thickness ratio ranges from 0.02 to 0.05.

In view of the above-mentioned experimental results of the present invention, by preferably setting the electrode length ratio to increase the voltage-rise ratio and the output power and by preferably setting the thickness ratio to increase the efficiency, it is possible to realize a piezoelectric transformer with an increased efficiency, increased output power and increased voltage-rise ratio simultaneously.

To be more specific, the voltage-rise ratio of not less than 120 and the output power of not less than 14 W can be obtained from the piezoelectric transformer when the electrode length ratio thereof ranges from 0.6 to 0.9; and the efficiency equal to or greater than 80% can be obtained therefrom when the thickness ratio thereof ranges from 0.01 to 0.06. In particular, the voltage-rise ratio of about 160 and the output power of not less than 25 W can be obtained when the electrode length ratio thereof ranges from 0.7 to 0.8; and the efficiency equal to or greater than 90% can be obtained when the thickness ratio thereof ranges from 0.02 to 0.05.

Figure 6A:
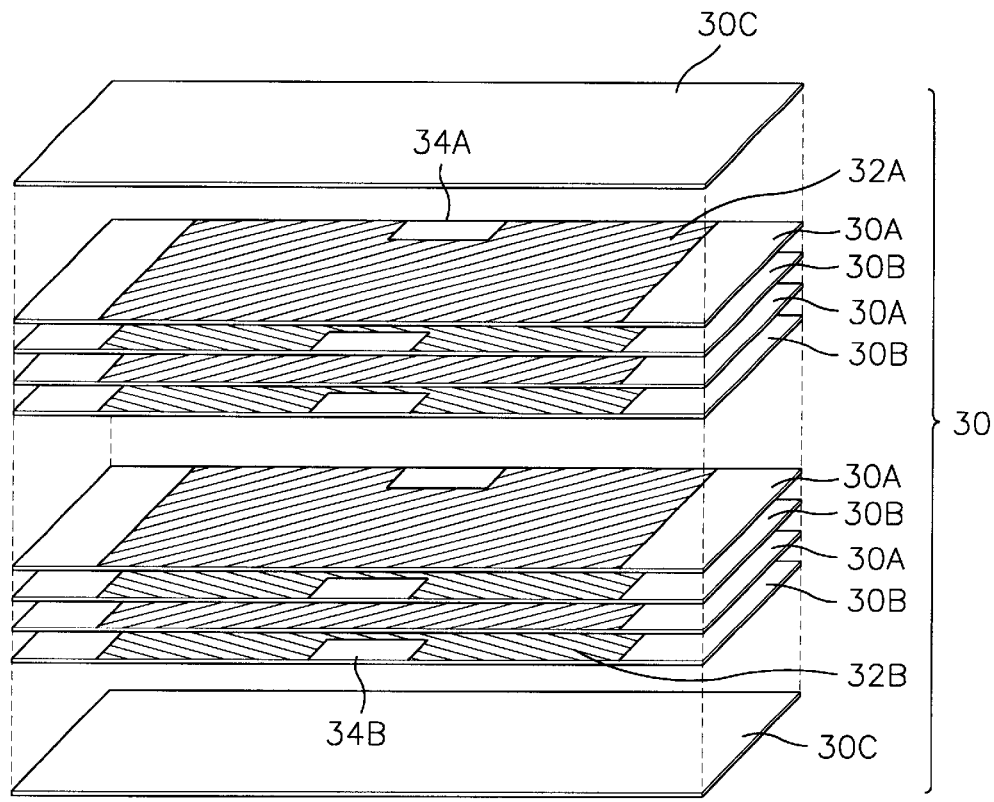
FIGS. 6A to 6C illustrate schematic diagrams showing the laminated structure of the piezoelectric transformer in accordance with another preferred embodiment of the present invention.
Figure 6B:
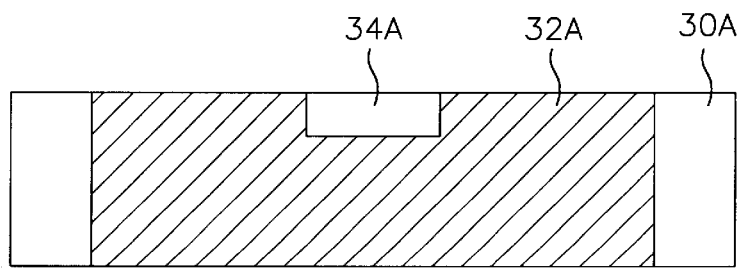
Figure 6C:
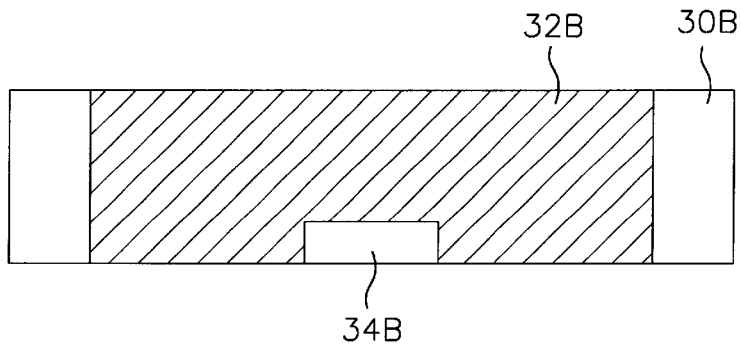

Referring to FIG. 6, a piezoelectric transformer in accordance with another preferred embodiment of the present invention will be described. As illustrated in FIG. 6A, a piezoelectric member of the piezoelectric transformer is formed by laminating a plurality of thin piezoelectric sheets 30. The piezoelectric transformer sheets 30 are formed by using the so-called doctor blade process and are made of, e.g., lead-zirconate-titanate. Each of input electrode patterns 32 are formed at the center portion of each of the piezoelectric sheets 30 by using an appropriate method, e.g., a screen printing method. In this case, as illustrated in FIGS. 6B and 6C, two types of input electrode patterns, e.g., a first and a second input electrode patterns 32A and 32B, are prepared. The two types of input electrode patterns are identical except the positions at which cut portions 30A and 30B are located.

As illustrated in FIG. 6B, the first type input electrode pattern 32A is formed on top of a piezoelectric sheet 30A with the cut portion 34A being located at one side of the piezoelectric sheet 30A. As illustrated in FIG. 6C, the second type input electrode pattern 32B is formed on top of a piezoelectric sheet 30B with the cut portion 34B being located at one side of the piezoelectric sheet 30B, the side of the piezoelectric sheet 30B at which the cut portion 34B being located being the opposite side of the side at which the cut portion 34A is located on the piezoelectric sheet 30A.

The piezoelectric sheets 30A and 30B illustrated in FIGS. 6B and 6C having the first and second type input electrode patterns 32A and 32B formed on top thereof, respectively, are laminated alternatively as shown in FIG. 6A. Further, two dummy piezoelectric sheets 30C having no input electrode patterns formed thereon are incorporated as a top and a bottom protection layers of the piezoelectric sheets 30.

Figure 7A:
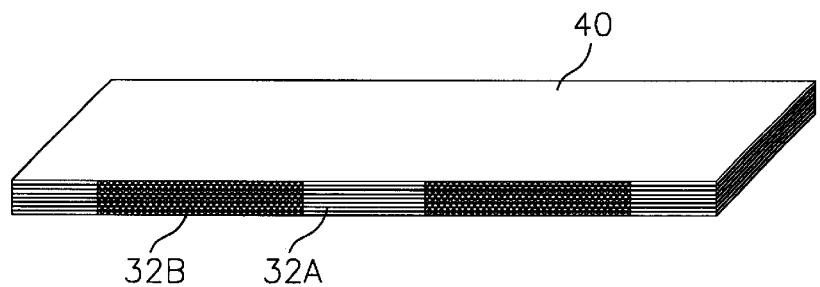
FIGS. 7A to 7D represent the manufacturing steps and polarization configuration of the piezoelectric transformer in accordance with the another preferred embodiment of the present invention.
Figure 7B:
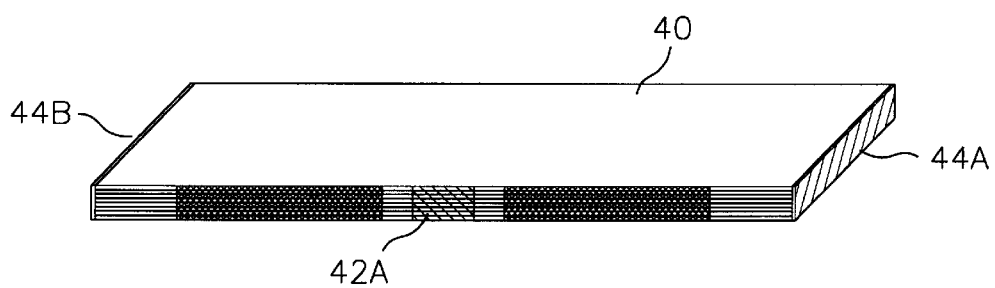

The laminated piezoelectric sheets are pressed in the thickness direction and binders therein are burn-out and then sintered. As a result, a sintered laminated type piezoelectric member 40 as represented in FIG. 7A is obtained. The input electrode patterns 32A and 32B become alternatively laminated at the center portion of the piezoelectric member 40. As represented in FIG. 7B, outer terminal electrodes 42A and 42B (not shown) are formed on two opposite sides of the center portion of the piezoelectric member 40, respectively, the outer electrodes 42A and 42B facing each other. As described in the above, as a result of the input electrode patterns 32A and 32B being produced with the cut portions 34A and 34B at two opposite sides thereof, respectively, the outer electrodes 42A and 42B become coupled to the input electrode patterns 32A and 32B, respectively.

Figure 7C:
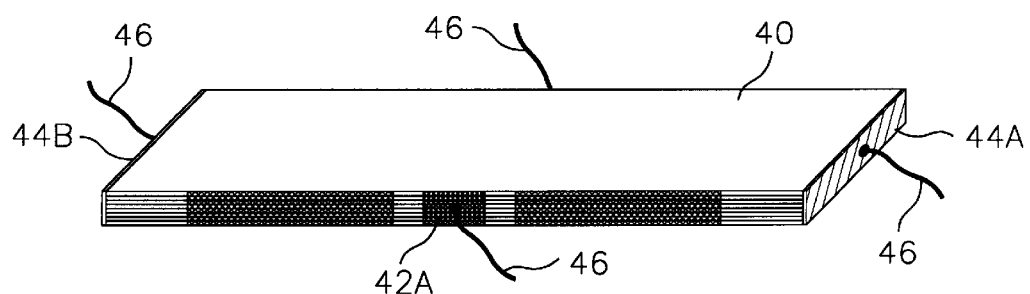
Figure 7D:
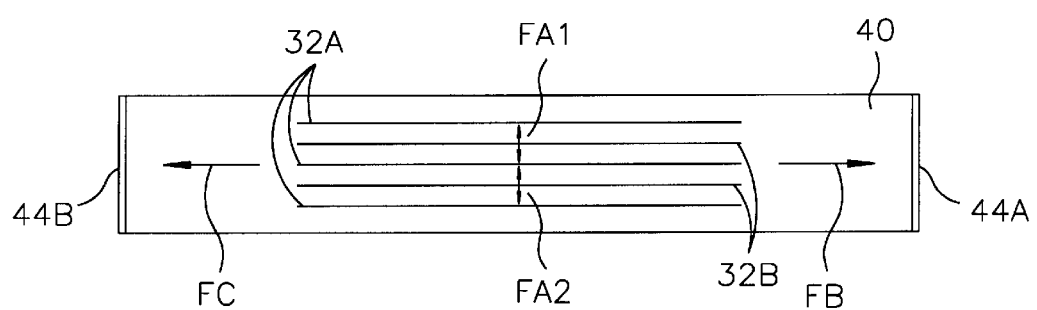
Figure 8:
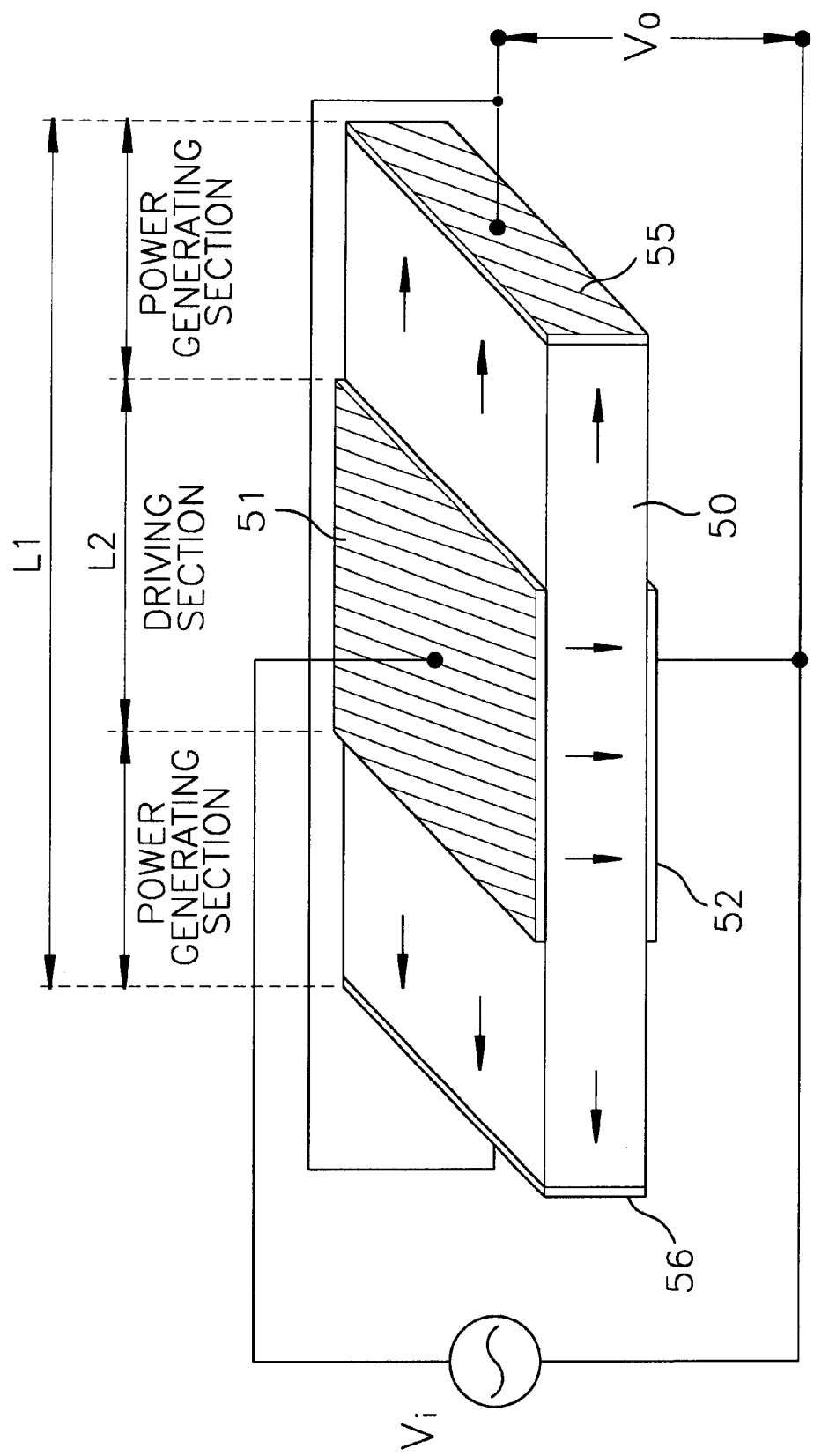
FIG. 8 shows an exemplary piezoelectric transformer of a prior art.

Further, as shown in FIG. 7C, output electrodes 44A and 44B are formed on two opposite ends of the piezoelectric member 40, respectively. The outer electrodes 42A and 42B and the output electrodes 44A and 44B are formed by using a conventional electrode forming method, e.g., a silver paste-baking method. A lead wire 46 is connected to the outer electrodes 42A and 42B and the output electrodes 44A and 44B using a conductive resin or solder. Next, a direct current is applied between the input electrodes 32A and 32B through the outer electrodes 42A and 42B, thereby polarizing the center portion of the piezoelectric member 40. Further, a direct current is also applied between the outer electrodes 42A/42B and the output electrodes 44A/44B, thereby polarizing the right and left end portions of the piezoelectric member 40. For example, as shown in FIG. 7D, the center portion of the piezoelectric member 40 is polarized in the thickness directions as indicated by arrows FA1 and FA2 (or their corresponding reverse directions); and the right and left end portions of the piezoelectric member 40 is polarized in the longitudinal directions and opposite directions from each other as indicated by arrows FB and FC (or their corresponding reverse directions).

A plurality of piezoelectric transformer samples having above-mentioned configurations with different dimensions as listed in the following table 1 are provided in accordance with the present invention.

In table 1, the number of laminated piezoelectric sheets for each of the samples A to E is 15. The length (LA of FIG. 1) of the laminated piezoelectric member is 30 mm for all the samples A to E. However, the thickness for each of the samples A to E is different from each other. The thickness for each of the samples A and E is 1.5 mm but that for the samples B to D is 0.9 mm.

TABLE 1

| | longitudinal length (mm) | thickness (mm) | electrode length ratio | the number of laminated sheets | thickness ratio |
|---|---|---|---|---|---|
| sample A | 30 | 1.5 | 0.50 | 15 | 0.05 |
| sample B | 30 | 0.9 | 0.70 | 15 | 0.03 |
| sample C | 30 | 0.9 | 0.75 | 15 | 0.03 |
| sample D | 30 | 0.9 | 0.80 | 15 | 0.03 |
| sample E | 30 | 1.5 | 0.70 | 15 | 0.05 |

Even if the samples incorporate therein the identical number of piezoelectric sheets the samples can still have different overall thickness from each other as a result of the thickness of the piezoelectric sheet used being different. Accordingly, the thickness ratio for each of the samples A and E becomes 0.05; and that for each of the samples B to D becomes 0.03. Further, the length of the input electrodes 32 for the samples A to E are set such that the electrode length ratio of the sample A becomes 0.50; that for each of the samples B and E becomes 0.70; that for the sample C becomes 0.75; and that for the sample D becomes 0.80.

The voltage-rise ratios, output powers and efficiencies of the samples A to E obtained experimentally are listed in table 2 for a situation under which a sine wave voltage of 4.5 $V_{p-p}$ together with a load of 100 kΩ is applied on the samples A to E.

TABLE 2

| | voltage-rise ratio (times) | output power (W) | efficiency (%) |
|---|---|---|---|
| sample A | 120 | 3.2 | 85 |
| sample B | 200 | 4.4 | 85 |
| sample C | 225 | 4.5 | 85 |
| sample D | 205 | 4.5 | 85 |
| sample E | 140 | 3.3 | 75 |

In table 2, the samples B and E having equal electrode length ratios and different thickness ratios thereof are compared with each other. In this case, the voltage-rise ratio, output power and efficiency for the sample B having the thickness ratio of 0.03 are greater than those for the sample E having the thickness ratio of 0.05, respectively. In comparison with the sample E having the electrode length ratio of 0.70, the sample A having the electrode length ratio of 0.50 exhibits a greater efficiency as shown in FIG. 3 but a lower voltage-rise ratio and a lower output power.

In comparison with the samples A and E, the samples B to D having the thickness ratio of 0.03 and the electrode length ratio of 0.70 to 0.80 exhibit greater voltage-rise ratio, output power and efficiency.

As described above, in accordance with the preferred embodiments of the present invention, the electrode length ratio of the piezoelectric member of the piezoelectric transformer is preferably determined such that the increased voltage-rise ratio and output power thereof are obtained. Thereafter, the thickness ratio is set preferably such that the increased efficiency thereof is achieved.

Accordingly, there can be provided a piezoelectric transformer exhibiting increased voltage-rise ratio, output power and efficiency. In detail, in accordance with the preferred embodiments of the present invention, the electrode length ratio thereof is set as ranging from 0.6 to 0.9, more preferably 0.7 to 0.8 and the thickness ratio thereof is set as ranging from 0.01 to 0.06, more preferably 0.02 to 0.05 to thereby provide a piezoelectric transformer with improved properties.

There may be many embodiments in accordance with the present invention. Many modifications and variations are possible based on the above-mentioned embodiments of the present invention. For example, following embodiments may be included.

First, in the above-mentioned embodiments, the input electrodes are mounted or formed on the center portion of the piezoelectric member. However, the input electrodes may be located or coupled on an end portion, e.g., a right or a left end portion, of the piezoelectric member.

Second, in the above-mentioned embodiments, materials and methods are described only for an illustrative purpose and accordingly other materials and methods can be employed. A long-plate-shaped piezoelectric member may be formed by either a plurality of laminated piezoelectric sheets as represented in FIGS. 6 and 7 or a bulk type piezoelectric member as a single piezoelectric layer as illustrated in FIG. 1. The number of the laminated sheets may be advantageously increased or decreased depending on the need. A laminated structure of a piezoelectric member may result in decreasing the polarization voltage for a piezoelectric transformer.

Third, the right and left end portions of the piezoelectric member may be polarized in identical longitudinal directions with each other as indicated by dot-lined arrows FQ and FP (or their corresponding reverse directions) in FIG. 1 while the right and left end portions thereof are polarized in opposite longitudinal directions with each other in the above-mentioned embodiments. In this case, the vibration directions of the output electrodes 16 and 18 coincide with each other to thereby increase a corresponding voltage-rise ratio up to about 2 times that of the above-mentioned embodiments of the present invention.

In view of the foregoing, the effect of the present invention can be summarized as follows. First, the thickness ratio LC/LA of the piezoelectric member is set as ranging from 0.01 to 0.06, preferably 0.02 to 0.05, thereby enhancing the efficiency thereof. Second, the length ratio LB/LA of the piezoelectric member is set as ranging from 0.6 to 0.9, preferably 0.7 to 0.8, thereby obtaining enhanced efficiency, high voltage-rise ratio and the increased efficiency thereof.

While the present invention has been described with respect to certain preferred embodiments only, other modifications and variations may be made without departing from the spirit and scope of the present invention as set forth in the following claims.

What is claimed is:

1. A piezoelectric transformer comprising:

a long-plate-shaped piezoelectric member being polarized in a thickness direction and a longitudinal direction; and input electrodes and output electrodes mounted on the piezoelectric member, the input electrodes being located at a center portion thereof, wherein a thickness ratio LC/LA of the piezoelectric member ranges from 0.01 to 0.06 and an electrode length ratio LB/LA of the piezoelectric member is greater than 0.6 and not greater than 0.9, LC and LA being a thickness and a longitudinal length of the piezoelectric member, respectively, and LB being a length of each of the input electrodes in the longitudinal direction.

2. The piezoelectric transformer according to claim 1, wherein the thickness ratio LC/LA ranges from 0.02 to 0.05.

3. The piezoelectric transformer according to claim 1, wherein the electrode length ratio LB/LA ranges from 0.7 to 0.8.

4. The piezoelectric transformer according to claim 3, wherein the thickness ratio LC/LA ranges from 0.02 to 0.05.

5. The piezoelectric transformer according to claim 3, wherein the piezoelectric member includes laminated piezoelectric layers.

6. The piezoelectric transformer according to claim 1, wherein the piezoelectric member consists of a monolayer.

7. The piezoelectric transformer according to claim 1, wherein the center portion of the piezoelectric member is polarized in the thickness direction and right and left portions of the piezoelectric member are polarized in the longitudinal direction.

* * * * *